(12) United States Patent
Jeong et al.

(10) Patent No.: US 8,334,650 B2
(45) Date of Patent: Dec. 18, 2012

(54) ORGANIC LIGHT EMITTING DIODE DISPLAY

(75) Inventors: Hee-Seong Jeong, Yongin (KR); Sung-Soo Koh, Yongin (KR); Tae-Gon Kim, Yongin (KR); Seung-Yeon Cho, Yongin (KR); Chul-Woo Jeong, Yongin (KR); Jae-Yong Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 12/961,396

(22) Filed: Dec. 6, 2010

(65) Prior Publication Data

US 2011/0133634 A1 Jun. 9, 2011

(30) Foreign Application Priority Data

Dec. 8, 2009 (KR) .................. 10-2009-0121362

(51) Int. Cl.
*H01J 1/62* (2006.01)
*H01J 63/04* (2006.01)
(52) U.S. Cl. ........ 313/504; 313/498; 313/506; 313/512; 313/112
(58) Field of Classification Search .......... 313/498–512, 313/110–113
See application file for complete search history.

(56) References Cited

U.S. PATENT DOCUMENTS

| | | |
|---|---|---|
| 2003/0122481 A1 | 7/2003 | Song et al. |
| 2003/0127971 A1* | 7/2003 | Hofstra et al. ............... 313/504 |
| 2004/0155576 A1* | 8/2004 | Tyan et al. .................. 313/504 |
| 2005/0012455 A1 | 1/2005 | Lee et al. |
| 2005/0073243 A1* | 4/2005 | Yamazaki et al. ........... 313/498 |
| 2005/0200270 A1* | 9/2005 | Kwak et al. ................. 313/502 |
| 2007/0285003 A1* | 12/2007 | Smith et al. ................. 313/504 |
| 2008/0231176 A1* | 9/2008 | Lee et al. .................... 313/504 |

FOREIGN PATENT DOCUMENTS

| | | |
|---|---|---|
| KR | 10-2002-0069319 A | 8/2002 |
| KR | 1020050000862 | 1/2005 |
| KR | 10-2005-0015820 A | 2/2005 |
| KR | 1020050086626 | 8/2005 |
| KR | 10-2007-0092079 A | 9/2007 |
| KR | 10-2007-0120432 A | 12/2007 |

* cited by examiner

*Primary Examiner* — Anh Mai
*Assistant Examiner* — Kevin Quarterman
(74) *Attorney, Agent, or Firm* — Knobbe Martens Olson & Bear LLP

(57) ABSTRACT

An organic light emitting diode display device is disclosed. The device includes: a substrate; a functional layer positioned on the substrate and making constructive interference of transmitted lights; a first electrode positioned on the functional layer; an organic emission layer positioned on the first electrode; and a second electrode positioned on the organic emission layer.

18 Claims, 11 Drawing Sheets

FIG.6

| EML (RED) 400 | EML (GREEN) 200 | EML (BLUE) 200 |
| | AI 1000 | |
| | EIL 15 | |
| | ETL 360 | |
| | HTL 700 | |
| HIL-R 780 | HIL-G 400 | |
| | HIL 520 | |
| | ITO 70 | |
| | Ag 150 | |
| | ITO 70 | |

(a)

| EML (RED) 400 | EML (GREEN) 200 | EML (BLUE) 200 |
| | AI 1000 | |
| | EIL 15 | |
| | ETL 360 | |
| | HTL 700 | |
| HIL-R 780 | HIL-G 400 | |
| | HIL 520 | |
| | Ag 150 | |
| | ITO 800 | |
| | Ag 100 | |

|  | Comparative Example | Exemplary Embodiment |
|---|---|---|
| CIE_x | 0.3298 | 0.3131 |
| CIE_y | 0.3553 | 0.3352 |
| Reflectance (%) | 100 | 80.2 |
| Color temperature(K) | 5604.8 | 6438.1 |

ORGANIC LIGHT EMITTING DIODE DISPLAY

CROSS-REFERENCE TO RELATED APPLICATIONS

This application claims priority to and the benefit of Korean Patent Application No. 10-2009-0121362 filed in the Korean Intellectual Property Office on Dec. 8, 2009, the entire content of which is incorporated herein by reference.

BACKGROUND

1. Field

The described technology relates generally to an organic light emitting diode display. More particularly, the described technology relates to an organic light emitting diode display that uses constructive interference of light.

2. Description of the Related Technology

Organic light emitting diode displays have self-emissive characteristics, and have a relatively small thickness and weight due to not requiring a separate light source. Organic light emitting diode displays generally exhibit high-quality characteristics such as low power consumption, high luminance, high response speed, etc.

Conventional organic light emitting diode displays generally include a first substrate having an organic light emitting diode and a second substrate facing the first substrate and protecting the organic light emitting diode of the first substrate.

Organic light emitting diodes included in conventional organic light emitting diode displays generally include a first electrode and a second electrode facing each other, and an organic emission layer for emitting light, with the organic emission layer interposed between the two electrodes.

Conventional organic light emitting diode displays usually have lowered visibility of images displayed by light emitted from the organic emission layer due to external light reflection, whereby light irradiated from the outside is reflected by at least one of the first and second electrodes. Particularly, if the first electrode or the second electrode is a light reflective electrode, the aforementioned external light reflection becomes more serious, thereby further lowering the visibility of an image.

Some conventional organic light emitting diode displays have a polarizing plate attached to the surface of at least one of the first and second substrates in order to address the lower visibility issue mentioned above. However, the luminous efficiency of the light emitted from the organic emission layer is lowered due to this polarizing plate, and the thickness of the polarizing plate is added to the thickness of the organic light emitting diode display.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One aspect is an organic light emitting diode display device, including: a substrate; a functional layer positioned on the substrate, configured to produce constructive interference of lights transmitted from the outside; a first electrode positioned on the functional layer; an organic emission layer positioned on the first electrode; and a second electrode positioned on the organic emission layer.

Another aspect is an organic light emitting diode display device wherein the functional layer includes: a first semi-transmissive layer positioned on the substrate; a transmissive layer positioned on the first semi-transmissive layer; and a second semi-transmissive layer positioned on the transmissive layer.

Another aspect is an organic light emitting diode display device wherein the first electrode is light transmissive, and the second electrode is light reflective.

Another aspect is an organic light emitting diode display device wherein the thickness of the transmissive layer is greater than the thickness of the first semi-transmissive layer and greater than the thickness of the second semi-transmissive layer.

Another aspect is an organic light emitting diode display device wherein the first semi-transmissive layer and the second semi-transmissive layer each include a single layer or multiple layers each including at least one of Ag, Al, Ca, and Mg.

Another aspect is an organic light emitting diode display device wherein the transmissive layer includes at least one of ITO, IZO, AZO, $SiO_2$, $SiN_x$, $Nb_2O_5$, and $TiO_2$.

Another aspect is an organic light emitting diode display device wherein the transmissive layer has a transmittance of between about 80% and about 100%.

Another aspect is an organic light emitting diode display device wherein the functional layer is in contact with the first electrode.

Another aspect is an organic light emitting diode display device wherein the functional layer is spaced apart from the first electrode.

Another aspect is an organic light emitting diode display device, including: a substrate configured to substantially transmit incoming light from the exterior of the device; a functional layer positioned over the substrate and configured to optically process light from the substrate, wherein the functional layer includes: a first semi-transmissive sub-layer configured to at least partially reflect and at least partially transmit light incident to the first semi-transmissive sub-layer; a second semi-transmissive sub-layer configured to at least partially reflect and at least partially transmit light incident to the second semi-transmissive sub-layer; a transmissive sub-layer disposed between the first and second semi-transmissive sub-layers, the transmissive sub-layer being configured to substantially transmit light incident to the transmissive sub-layer, a first electrode positioned over the functional layer and configured to substantially transmit light incident to the first electrode; an organic emission layer positioned over the first electrode, wherein the organic emission layer is configured to emit visible light and substantially transmit light incident to the organic emission layer; and a second electrode positioned over the organic emission layer and configured to substantially reflect light incident to the second electrode.

Another aspect is an organic light emitting diode display device configured to permit a first light beam from the exterior of the device to pass through the functional layer, the first electrode and the organic emissive layer, and to be reflected at the second electrode.

Another aspect is an organic light emitting diode display device is further configured to permit a second light beam from the exterior of the device to pass through the first semi-transmissive sub-layer and the transmissive sub-layer, and to be reflected at the second semi-transmissive sub-layer such that the second light beam is constructively reinforced with the first light beam.

Another aspect is an organic light emitting diode display device wherein the first and second light beams are further constructively reinforced with a light beam emitted from the organic emission layer.

Another aspect is an organic light emitting diode display device further configured to permit a second light beam from the exterior of the device to be reflected at the first semi-transmissive sub-layer such that the second light beam is constructively reinforced with the first light beam.

Another aspect is an organic light emitting diode display device further configured to permit a second light beam from the exterior of the device to pass through the first semi-transmissive sub-layer and the transmissive sub-layer, and to be reflected at the second semi-transmissive sub-layer, wherein the device is further configured to permit the second light beam to pass through the transmissive sub-layer and to be reflected at the first semi-transmissive sub-layer, wherein the device is further configured to permit the second light beam to pass through the transmissive sub-layer again and to be reflected at the second semi-transmissive sub-layer again such that the second light beam is constructively reinforced with the first light beam.

Another aspect is an organic light emitting diode display device further configured to permit a third light beam from the exterior of the device to be reflected at the first semi-transmissive sub-layer such that the third light beam is constructively reinforced with the second light beam.

BRIEF DESCRIPTION OF THE DRAWINGS

FIG. 6 is a cross-sectional view showing the main components of each of organic light emitting diode displays according to a comparative example and an exemplary embodiment.

FIG. 9 is a table comparing the external light reflectance of the comparative example to that of an exemplary embodiment.

DETAILED DESCRIPTION OF THE CERTAIN INVENTIVE EMBODIMENTS

Figure 1:
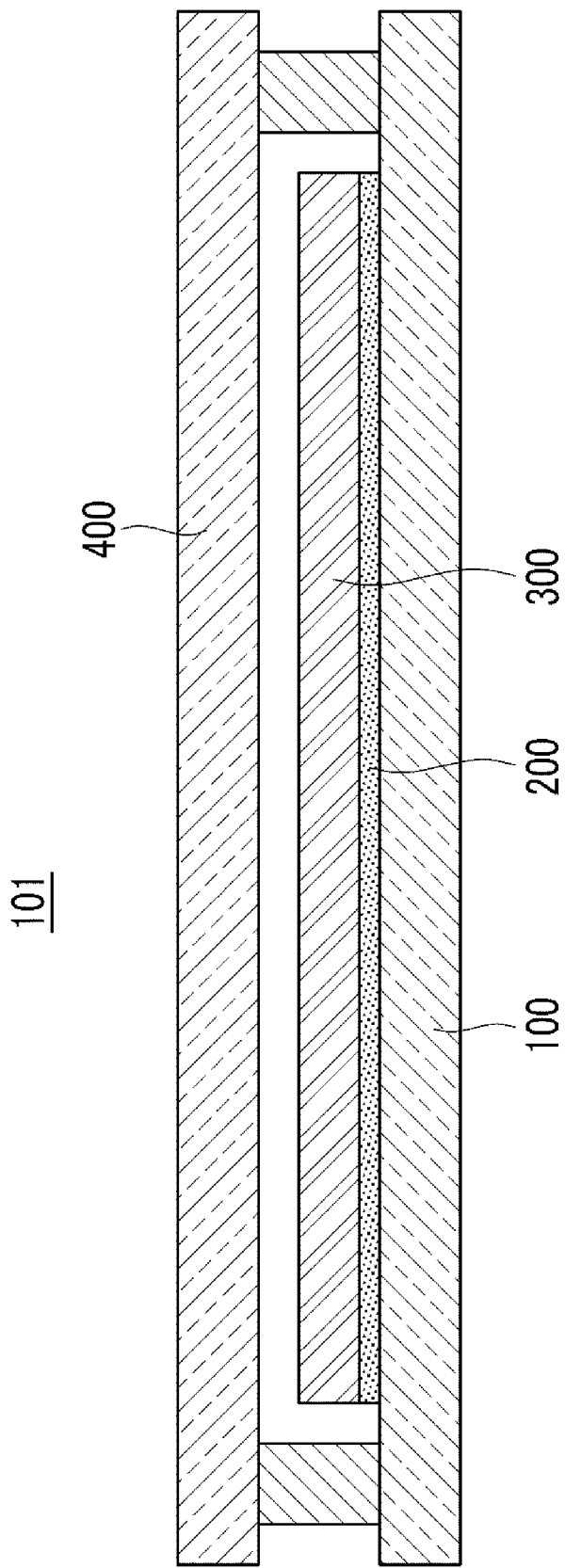
FIG. 1 is a cross-sectional view of an organic light emitting diode display according to an exemplary embodiment.

Hereinafter, various exemplary embodiments will be described in detail with reference to the attached drawings. As those skilled in the art would realize, the described embodiments may be modified in various ways, without departing from the spirit or scope of the present invention.

Accordingly, the drawings and description are to be regarded as illustrative in nature and not restrictive. Like reference numerals generally designate like elements throughout the specification.

In the drawings, the sizes and thicknesses of the components are merely shown for convenience of explanation, and the embodiments are not necessarily limited to the illustrations described and shown herein.

When an element such as a layer, a film, an area, a plate, etc. is referred to as being formed on another element, the element may be formed right on another element or the element may be formed on another element with a further element therebetween.

Throughout this specification and the claims that follow, unless explicitly described to the contrary, the word "comprise" and variations such as "comprises" or "comprising" will be understood to imply the inclusion of stated elements but not the exclusion of any other elements. Throughout this specification, it is understood that the term 'on' and similar terms are used generally and are not necessarily related to a gravitational reference.

An organic light emitting diode display 101 according to an exemplary embodiment will be described with reference to FIGS. 1 thru 5.

FIG. 1 is a cross-sectional view of an organic light emitting diode display according to an exemplary embodiment.

As shown in FIG. 1, the organic light emitting diode 101 according to an exemplary embodiment includes a first substrate 100, driving circuitry 200, an organic light emitting diode 300, and a second substrate 400.

The first substrate 100 and the second substrate 400 are light transmissive, and are each formed of an electrically insulating material such as glass, a polymer, or the like. The first substrate 100 and the second substrate 400 face each other, and are bonded together by a sealant. Driving circuitry 200 and the organic light emitting diode 300 are positioned between the first substrate 100 and the second substrate 400, and the first substrate 100 and the second substrate 400 protect the driving circuitry 200 and the organic light emitting diode 300 from external interference.

Driving circuitry 200 includes switching and driving thin film transistors 10 and 20 (shown in FIG. 2), and transmits a driving signal to the organic light emitting diode 300. The organic light emitting diode 300 emits light according to a signal received from driving circuitry 200.

The organic light emitting diode 300 is positioned on driving circuitry 200.

The organic light emitting diode 300 is positioned in a display area on the first substrate 100, and is formed using microelectromechanical systems (MEMS) technology, such as photolithography. The organic light emitting diode 300 receives signals from driving circuitry 200, and displays an image by the received signals.

The internal structure of the organic light emitting diode display 101 according to an exemplary embodiment will be described in detail with reference to FIGS. 2 thru 5.

Figure 2:
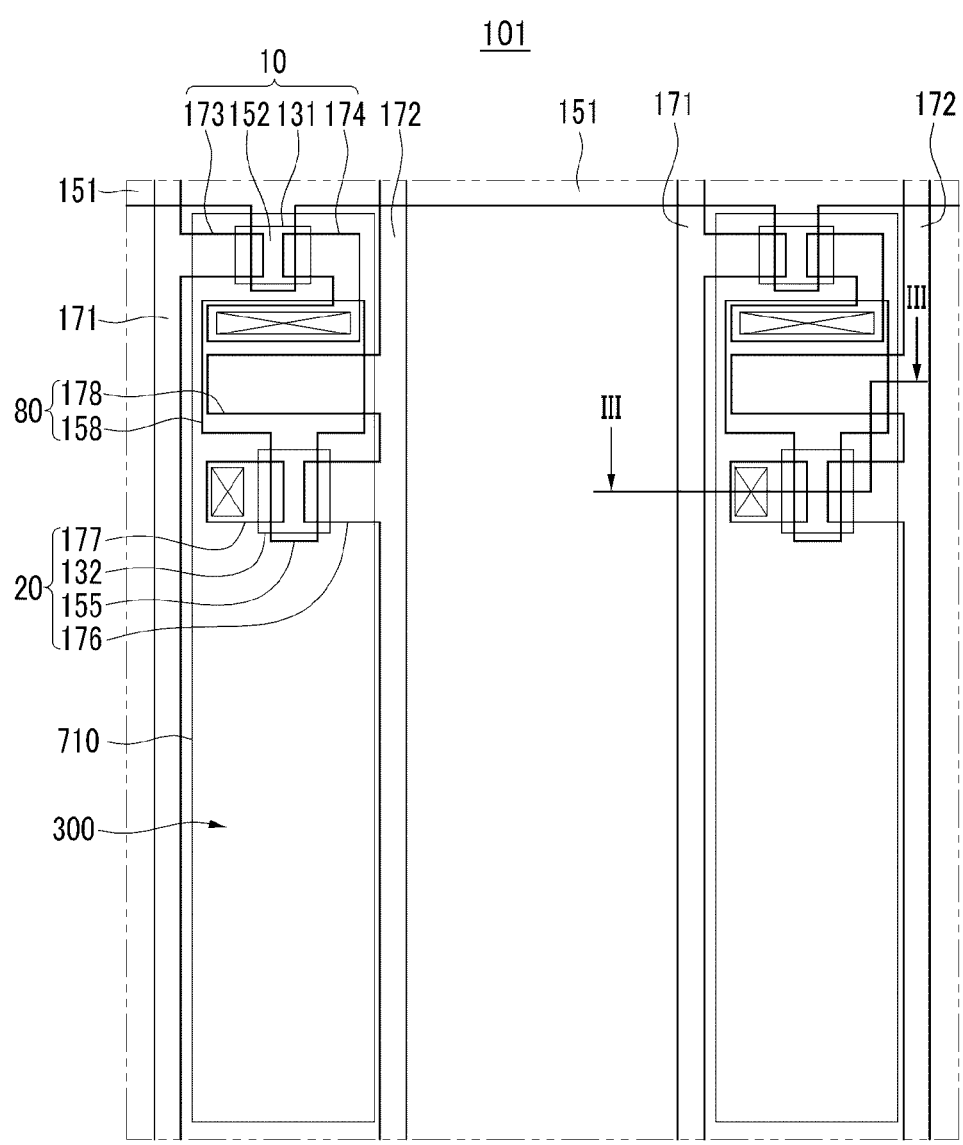
FIG. 2 is a layout view of a pixel structure of a display device according to an exemplary embodiment.
Figure 3:
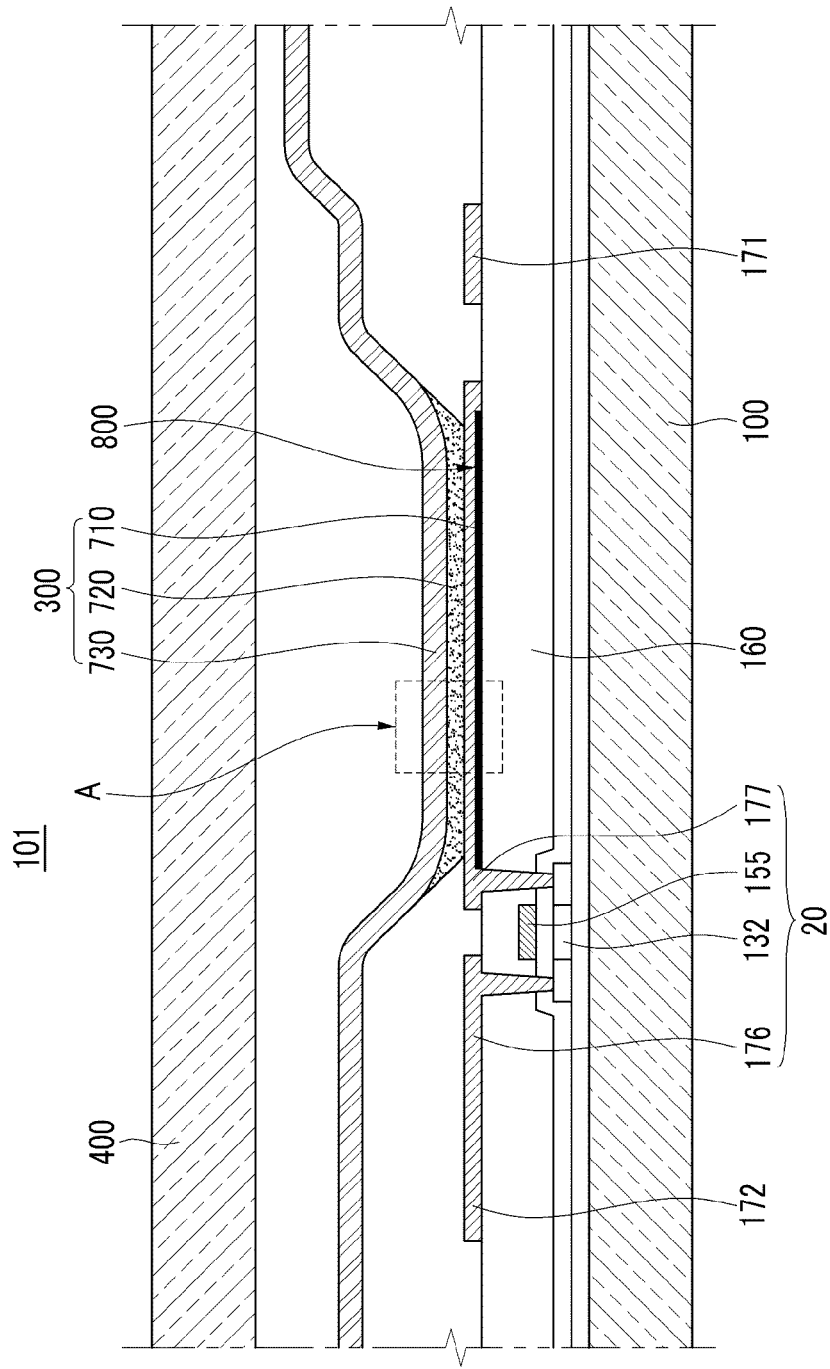
FIG. 3 is a cross-sectional view taken along line III-III of FIG. 2.

FIG. 2 is a layout view of a pixel structure of a display device according to an exemplary embodiment. FIG. 3 is a cross-sectional view taken along line III-III of FIG. 2.

One embodiment of the structures of the driving circuitry 200 and the organic light emitting diode 300 are shown in FIGS. 2 and 3. Other structures of the driving circuitry 200 and the organic light emitting diode 300 are also possible in other embodiments. For example, although the accompanied drawings illustrate an active matrix (AM)-type organic light emitting diode display having a 2Tr-1Cap structure as a display device in which one pixel includes two thin film transistors (TFTs) and one capacitor, other embodiments are also possible. The number of thin film transistors, the number of capacitors, and the number of lines of the display device are not limited to the embodiment shown in FIGS. 2 and 3. A pixel refers to the smallest unit displaying an image, and the display device displays an image through a plurality of pixels.

As shown in FIGS. 2 and FIG. 3, each pixel of an embodiment of the organic light emitting diode display 101 includes a switching thin film transistor 10, a driving thin film transistor 20, a capacitor 80, an organic light emitting diode 300, and a functional layer 800. A component including the switching thin film transistor 10, the driving thin film transistor 20, and the capacitor 80 is referred to as driving circuitry 200. The driving circuitry 200 further includes a gate line 151 arranged along one direction of the first substrate 100, a data line 171 insulated from, and crossing the gate line 151, and a common power line 172. In one embodiment, one pixel may be defined by the gate line 151, the data line 171, and the common line 172. Other embodiments are also possible.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 may be used as a switching element to select a pixel to emit light. The switching gate electrode 152 is connected to the gate line 151. The switching source electrode 173 is connected to the data line 171. The switching drain electrode 174 is separated from the switching source electrode 173 and is connected to one capacitor plate 158.

The driving thin film transistor 20 applies driving power to the first electrode 710 to emit light from the organic emission layer 720 of the organic light emitting diode 300 in the selected pixel. The driving gate electrode 155 is connected to the capacitor plate 158, which is in turn connected to the switching drain electrode 174. The driving source electrode 176 and the other capacitor plate 178 are connected to the common power line 172. The first electrode 710 of the organic light emitting diode 300 is positioned extending from the driving drain electrode 177, and the driving drain electrode 177 and the first electrode 710 are connected to each other.

The capacitor 80 includes a pair of capacitor plates 158 and 178, disposed with an interlayer insulating layer 160 interposed therebetween. The interlayer insulating layer 160 may be a dielectric material, and the storage capacity of the capacitor 80 is determined by the electric charges stored in the capacitor 80 and the voltage between the capacitor plates 158 and 178.

The switching thin film transistor 10 is driven by a gate voltage applied to the gate line 151, and supplies a data voltage applied to the data line 171 to the driving thin film transistor 20. A voltage corresponding to the difference between the common voltage, which is supplied from the common power line 172 to the driving thin film transistor 20, and the data voltage, which is supplied from the switching thin film transistor 10, is stored in the capacitor 80. A current corresponding to the voltage stored in the capacitor 80 flows into the organic light emitting diode 300 through the driving thin film transistor 20 to cause the organic light emitting diode 300 emit light.

The organic light emitting diode 300 includes a first electrode 710, an organic emission layer 720 positioned on the first electrode 710, and a second electrode 730 positioned on the organic emission layer 720.

Figure 4:
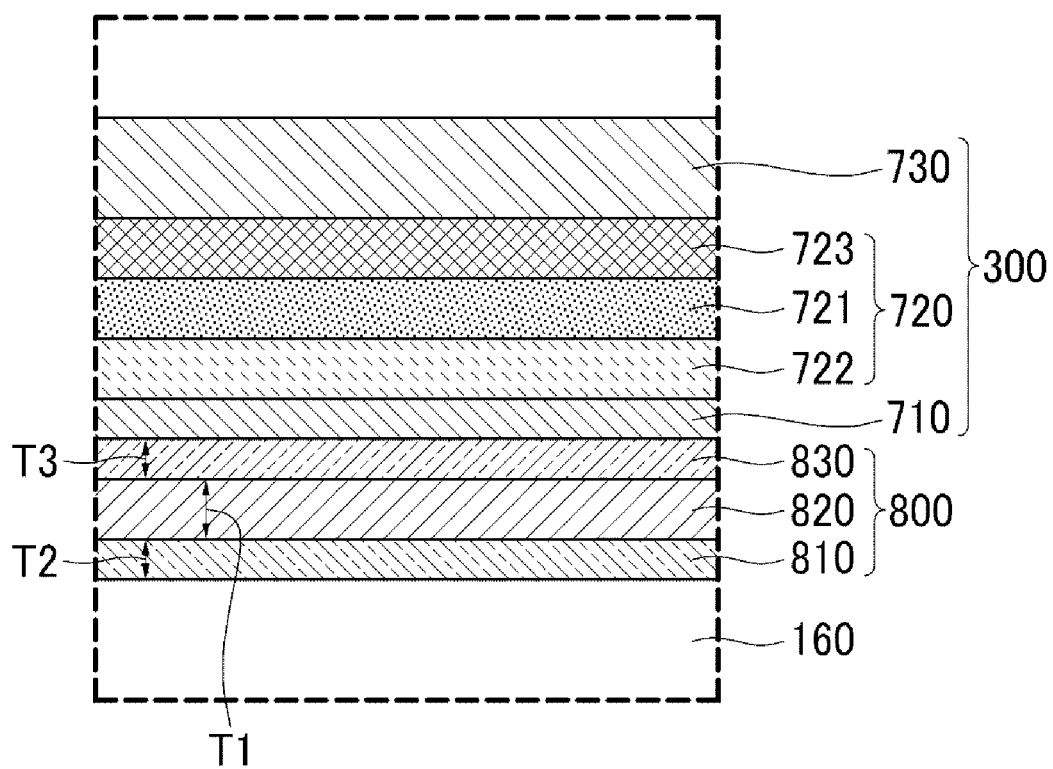
FIG. 4 is a magnified view of section A of FIG. 3.

FIG. 4 is a magnified view of section A of FIG. 3.

In the embodiment of FIG. 4, the first electrode 710 is an anode functioning as a hole injection electrode, and the second electrode 730 is a cathode functioning as an electron injection electrode. In other embodiments, the pixel electrode 710 may be a cathode and the common electrode 730 may be an anode, according to a driving method of the display device 101. Holes and electrons may be injected into the organic emission layer 720 from the first electrode 710 and the second electrode 730, respectively, and when excitons formed by recombinations of the injected holes and electrons drop from an excited state to a ground state, the organic emission layer 720 emits light. The first electrode 710 may include a single layer or multiple layers of a light transmissive conductive material containing at least one of indium tin oxide (ITO) and indium zinc oxide (IZO), and the second electrode 730 may include a single layer or multiple layers of a light reflective conductive material containing at least one of aluminum Al and silver Ag.

The organic emission layer 720 includes a main light emitting layer 721 for emitting light, a hole organic layer 722 positioned between the main light emitting layer 721 and the first electrode 710, and an electron organic layer 723 positioned between the main light emitting layer 721 and the second electrode 730. The main light emitting layer 721 is where the holes and the electrons that are injected from the first electrode 710 and the second electrode 730 are combined. The hole organic layer 722 may include at least one hole injection layer and at least one hole transport layer, and the electron organic layer 723 may include at least one electron injection layer and at least one electron transport layer. The main light emitting layer 721 may include a red light emitting layer for emitting red light, a green light emitting layer for emitting green light, and a blue light emitting layer for emitting blue light.

In an organic light emitting diode display 101 according to an exemplary embodiment, the organic light emitting diode 300 emits light in the direction of the first substrate 100; it is a bottom emission type. The functional layer 800 is positioned between the first electrode 710, to which light is emitted from the organic emission layer 720, and the first substrate 100. More particularly, the functional layer is positioned between the first electrode 710 and the interlayer insulating layer 160, on a path through which light is emitted from the organic emission layer 720 and irradiated to the outside.

In other embodiments, the first electrode may be made of a light reflective conductive material and the second electrode may be made of a light transmissive conductive material, thereby forming a top emission type of organic light emitting diode display. In such a top emission type of organic light emitting diode display, the functional layer may be positioned between the second electrode and the second substrate that are on a path of light emitted from the organic emission layer.

The functional layer 800 may be positioned between the first electrode 710 and the first substrate 100, and may be in contact with the first electrode 710. The functional layer 800 may include a first semi-transmissive layer 810, a transmissive layer 820, and a second semi-transmissive layer 830. Although the functional layer 800 and the first electrode 710 appear to be formed on a single layer in FIG. 3, the functional layer 800 is formed as a different layer from the first electrode 710 as illustrated in FIG. 4, which is a magnified view of section A of FIG. 3.

The first semi-transmissive layer 810 and the second semi-transmissive layer 830 face each other, and include a single layer or multiple layers of material containing at least one of silver (Ag), aluminum (Al), calcium (Ca), and magnesium (Mg). The first semi-transmissive layer 810 and the second semi-transmissive layer 830 transmit a portion of the lights irradiated to the first semi-transmissive layer 810 and the second semi-transmissive layer 830 and reflect the remaining portion of those lights. Since the first semi-transmissive layer 810 and the second semi-transmissive layer 830 face each other, a portion of light is repeatedly reflected between the first semi-transmissive layer 810 and the second semi-transmissive layer 830 and the remaining portion is irradiated to the outside through the first semi-transmissive layer 810.

The transmissive layer 820 is positioned between the first semi-transmissive layer 810 and the second semi-transmissive layer 830 facing each other, and includes a conductive or insulating transparent material containing at least one of indium tin oxide (ITO), indium zinc oxide (IZO), Al-doped zinc oxide (AZO), silicon oxide (SiO2), silicon nitride (SiNx), niobium oxide (Nb2O5), and titanium oxide (TiO2) having transmittance of about 80% to less than about 100%. The first thickness T1 of the transmissive layer 820 is greater than the second thickness T2 of the first semi-transmissive layer 810 and the third thickness T3 of the second semi-transmissive layer 830. Since the first thickness T1 of the transmissive layer 820 is greater than the second thickness T2 of the first semi-transmissive layer 810 and the third thickness T3 of the second semi-transmissive layer 830, the light repeatedly reflected by the first semi-transmissive layer 810 and the second semi-transmissive layer 830 becomes constructive interference as it passes through the transmissive layer 820.

The functional layer 800 serves to make constructive interference of the lights irradiated from the organic emission layer 720 to the functional layer 800, as well as the lights irradiated from the outside to the functional layer 800. The functional layer 800 inhibits external light reflection, whereby light irradiated from the outside to the organic light emitting diode 300 positioned inside the organic light emitting diode display 101 is reflected by at least one of the first electrode 710 and the second electrode 730, by making constructive interference of the lights irradiated to the functional layer 800. The functional layer 800 is positioned between the first electrode 710 and the first substrate 100, and suppresses external light reflection caused by the second, light reflective electrode 730. The functional layer 800 also suppresses external light reflection caused by the first electrode 710 and the second electrode 730, thereby eliminating the need to attach a polarizing plate to the surface of at least one of the first substrate 100 and the second substrate 400. The elimination of the polarization plate contributes to a smaller thickness of the organic light emitting diode display 101. The mechanism by which the functional layer 800 of an exemplary embodiment produces constructive interference of the lights irradiated to the functional layer 800 will be described in detail below with reference to FIG. 5.

Figure 5:
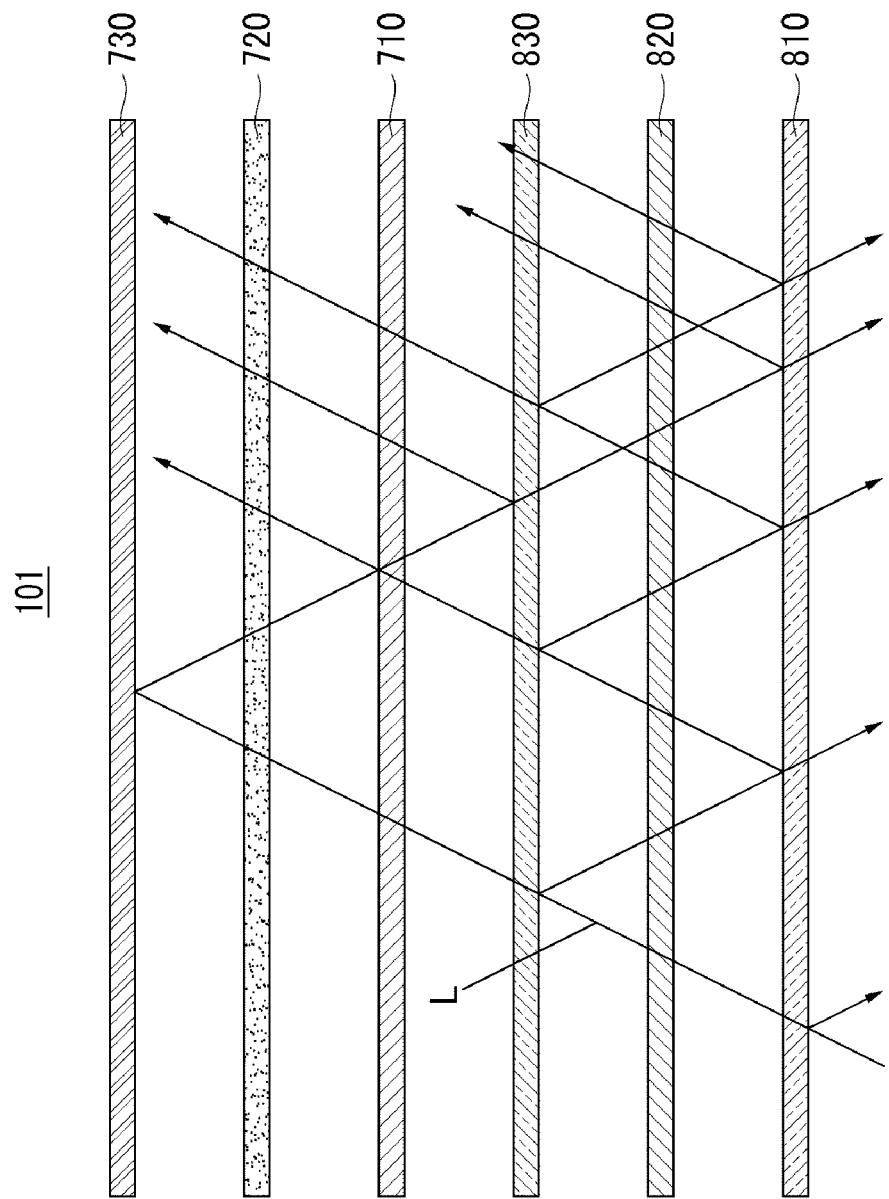
FIG. 5 illustrates a trajectory of light passing through an organic light emitting diode display according to an exemplary embodiment.

FIG. 5 illustrates a trajectory of light passing through an organic light emitting diode display according to an exemplary embodiment.

As shown in FIG. 5, a portion of light L irradiated from the outside to the second, light reflective electrode 730, after travelling through the first semi-transmissive layer 810, the second semi-transmissive layer 830, the first electrode 710, and the organic emission layer 720, is reflected by the first semi-transmissive layer 810 and the second semi-transmissive layer 830, and the remaining portion of light L is reflected by the second electrode 730.

A portion of the light reflected by the second semi-transmissive layer 830 is irradiated to the outside after travelling through the first semi-transmissive layer 810, and the remaining portion is reflected by the first semi-transmissive layer 810 and irradiated to the second electrode 730 after travelling through the second semi-transmissive layer 830, or is reflected by the second semi-transmissive layer 830 and irradiated again to the first semi-transmissive layer 810.

A portion of the light L irradiated from the outside is reflected or transmitted by the first semi-transmissive layer 810 or the second semi-transmissive layer 830, and is repeatedly reflected or transmitted between the first semi-transmissive layer 810 and the second semi-transmissive layer 830. One portion of the light L is reflected by the second electrode 730 and reflected or transmitted by the second semi-transmissive layer 830, and is repeatedly reflected or transmitted between the second electrode 730 and the second semi-transmissive layer 830. Another portion of the light L is reflected by the second electrode 730 and reflected or transmitted by the first semi-transmissive layer 810, and is repeatedly reflected or transmitted between the second electrode 730 and the first semi-transmissive layer 810. Lights L irradiated from the outside to the inside of the organic light emitting diode display 101 are repeatedly reflected or transmitted by the functional layer 800, and thus produce constructive interference. As the light irradiated to the functional layer 800 produces constructive interference, external light reflection is suppressed, and light irradiated from the outside is reflected by the organic light emitting diode 300.

Also, since the light emitted from the organic emission layer 720 is also repeatedly reflected or transmitted between the second electrode 730 and the second semi-transmissive layer 830, repeatedly reflected or transmitted between the first semi-transmissive layer 810 and the second semi-transmissive layer 830, and repeatedly reflected or transmitted between the second electrode 730 and the first semi-transmissive layer 810, a micro-cavity effect is generated in the light emitted from the organic emission layer 720.

External light reflection caused by the light irradiated from the outside is suppressed by the functional layer 800, and the functional layer 800 also generates a resonance effect in the light emitted from the organic emission layer 720, thereby enhancing the overall luminous efficiency of the organic light emitting diode display 101.

Conventional organic light emitting diode displays comprising a polarizing plate may exhibit decreased luminous efficiency and higher thickness of the organic light emitting diode display.

An exemplary embodiment exhibiting decrease of external light reflection of the organic light emitting diode display 101 according will be described with reference to FIGS. 6 thru 9. Thicknesses of the components are represented by the numbers in parentheses on the figures and the description below, and the unit of thickness is Å.

Figure 7:
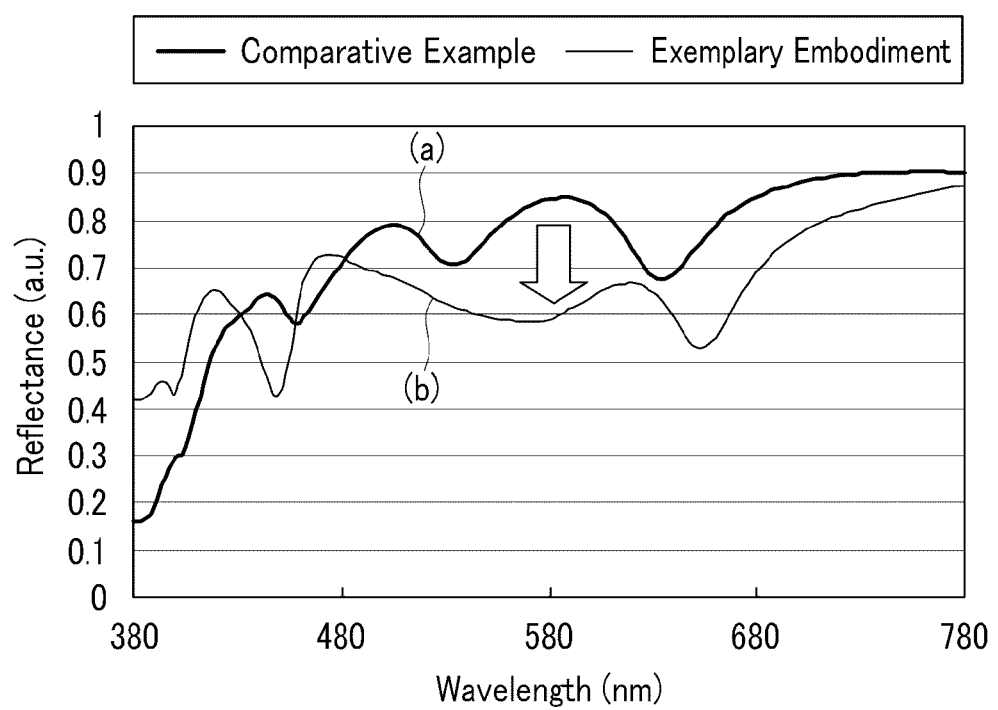
FIG. 7 is a graph illustrating reflectance of external light measured for each of the organic light emitting diode displays according to the comparative example and an exemplary embodiment.
Figure 8:
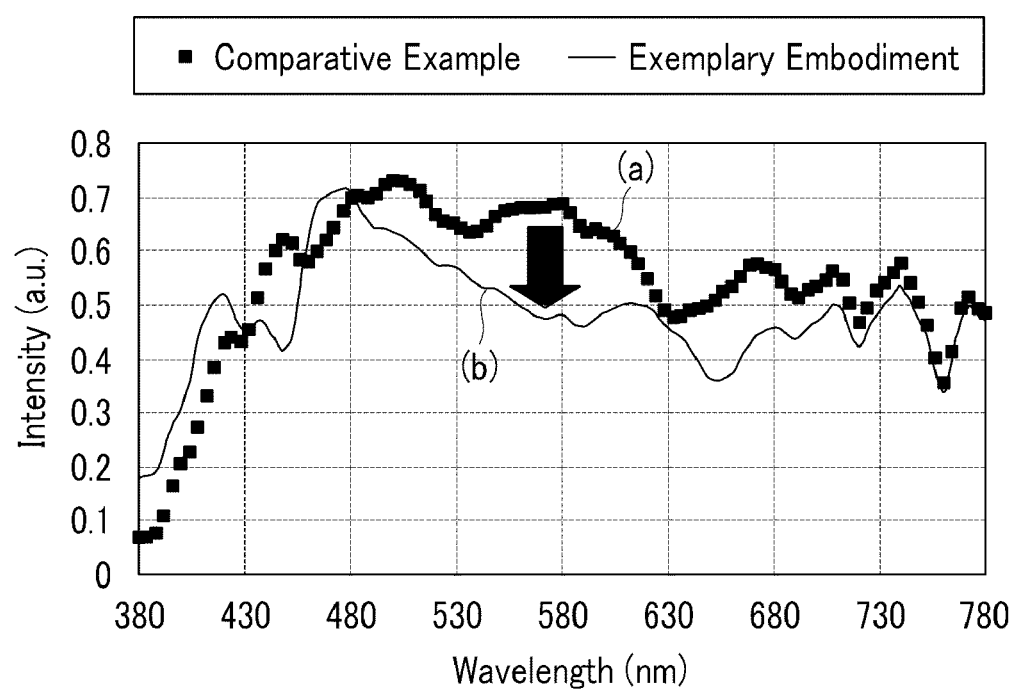
FIG. 8 is a graph illustrating the spectrum intensity of external light reflection measured for each of the organic light emitting diode displays according to the comparative example and an exemplary embodiment.

FIG. 6 is a cross-sectional view showing the main components of each of organic light emitting diode displays according to a comparative example and an exemplary embodiment. FIG. 7 is a graph illustrating reflectance of external light measured for each of the organic light emitting diode displays according to the comparative example and an exemplary embodiment. FIG. 8 is a graph illustrating the spectrum intensity of external light reflection measured for each of the organic light emitting diode displays according to the comparative example and an exemplary embodiment.

FIG. 6(a) is a cross-sectional view showing an organic light emitting diode display according to a comparative example. The organic light emitting diode display according to the comparative example includes a first electrode, an organic emission layer, and a second electrode. The first electrode includes a first transmissive layer 70 made of ITO, a semi-transmissive layer Ag (150) made of silver, and a second transmissive layer ITO (70) made of ITO, the organic emission layer includes a hole injection layer HIL (520), a red auxiliary hole injection layer HIL-R (780), a green auxiliary hole injection layer HIL-G (400), a hole transport layer HTL (700), a red light emitting layer EML (RED) (400), a green light emitting layer EML (GREEN) (200), a blue light emitting layer EML (BLUE) (200), an electron transport layer ETL (360), and an electron injection layer EIL (15), and the second electrode includes a light reflective layer Al (1000) made of aluminum.

Measurements of external light reflectance as a function of wavelength for the organic light emitting diode display according to the comparative example are shown in the graph of FIG. 7(a). Measurements of spectrum intensity of external light reflection as a function of wavelength for the organic light emitting diode display according to the comparative example are shown in the graph of FIG. 8(a).

FIG. 6(b) is a cross-sectional view showing an organic light emitting diode display according to an exemplary embodiment. The organic light emitting diode display according to an exemplary embodiment includes a functional layer, a first electrode, an organic emission layer, and a second electrode. The functional layer includes a first transmissive layer Ag (100) made of silver, a transmissive layer made of ITO (800), and a second semi-transmissive layer Ag (150) made of silver. The first electrode includes a light transmissive layer ITO (70) made of ITO. The organic emission layer includes a hole injection layer HIL (520), a red auxiliary hole injection layer HIL-R (780), a green auxiliary hole injection layer HIL-G (400), a hole transport layer HTL (700), a red light emitting layer EML (RED) (400), a green light emitting layer EML (GREEN) (200), a blue light emitting layer EML (BLUE) (200), an electron transport layer ETL (360), and an electron injection layer EIL (15). The second electrode includes a light reflective layer Al (1000) made of aluminum.

Measurements of external light reflectance as a function of wavelength for the organic light emitting diode display according to an exemplary embodiment are as shown in the graph of FIG. 7(b), and measurements of the spectrum intensity of external light reflection as a function of wavelength for the organic light emitting diode display according to an exemplary embodiment is as shown in the graph of FIG. 8(b).

A comparison of the reflectance of the organic light emitting diode display of the comparative example with the reflectance of the organic light emitting diode display of an exemplary embodiment demonstrated that an organic light emitting diode display including a functional layer has lower external light reflectance as a function of wavelength in a visible light region when compared with an organic light emitting diode display without such a functional layer.

A comparison of the spectrum intensity of external light reflection of the organic light emitting diode of the comparative example with the spectrum intensity of external light reflection of the organic light emitting diode display of an exemplary embodiment demonstrated that an organic light emitting diode display including a functional layer has lower spectrum intensity of external light reflection as a function of wavelength in a visible light region when compared with an organic light emitting diode display without such a functional layer.

FIG. 9 is a table comparing the external light reflectance of the comparative example to that of an exemplary embodiment.

As shown in FIG. 9, it was found that the external light reflectance of the organic light emitting diode display according to an exemplary embodiment including a functional layer is about 19.8% lower than the external light reflectance of the organic light emitting diode display according to the comparative example. This demonstrates that the functional layer helps suppress external light reflection.

In some embodiments, the first semi-transmissive layer 810, the transmissive layer 820, and the second semi-transmissive layer 830 included in the functional layer 800 are adjacent to each other. In other embodiments, the layers may be spaced apart from one another, and other components may be present between each of the first semi-transmissive layer 810, the transmissive layer 820, and the second semi-transmissive layer 830 included in the functional layer 800.

An organic light emitting diode display 102 according to an exemplary embodiment will be described with reference to FIGS. 10 and 11.

Figure 10:
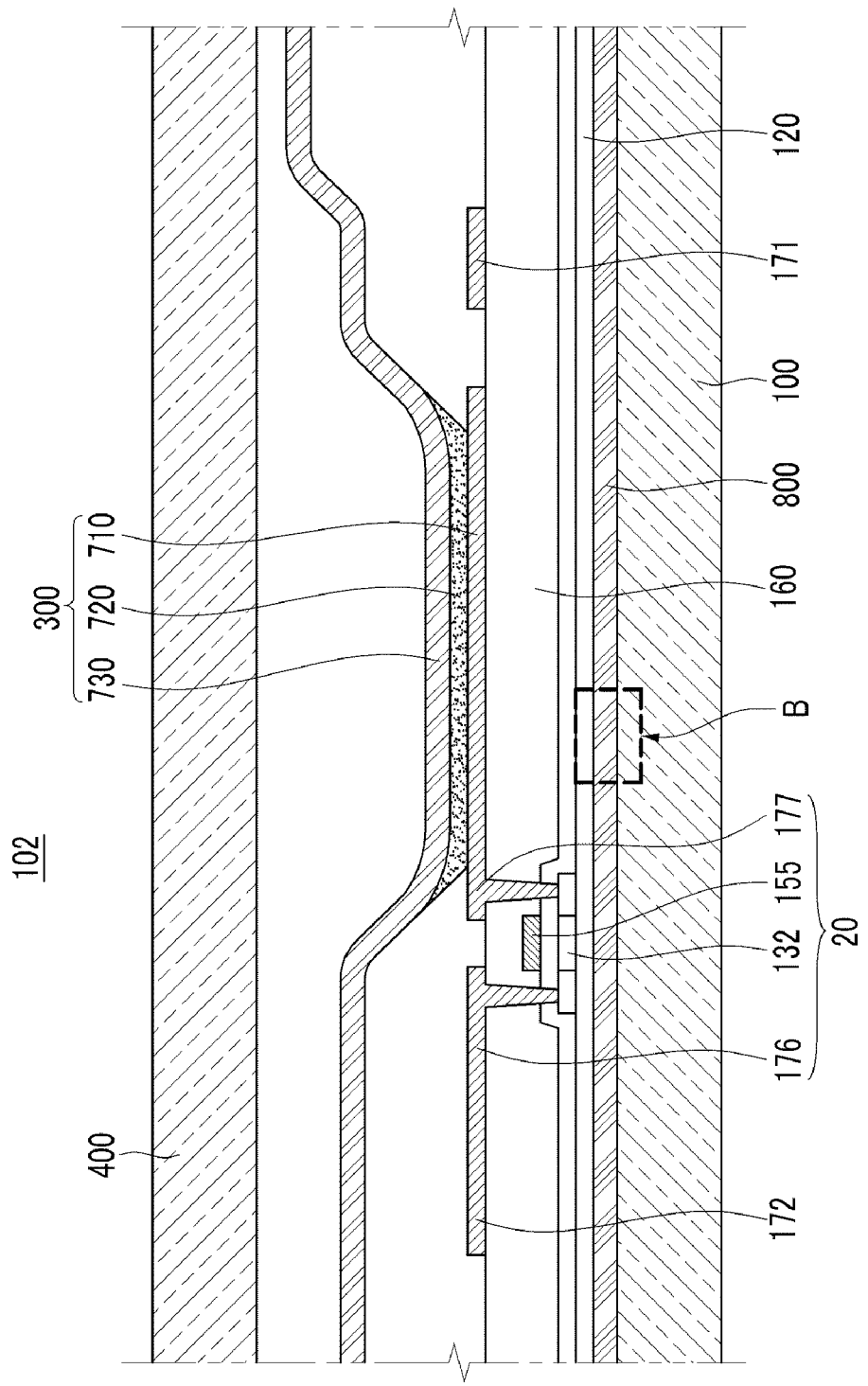
FIG. 10 is a cross-sectional view showing the main parts of an organic light emitting diode display according to an exemplary embodiment.

FIG. 10 is a cross-sectional view showing the main parts of an organic light emitting diode display according to an exemplary embodiment.

As shown in FIG. 10, the display 102 according to an exemplary embodiment includes a first substrate 100, a functional layer 800 positioned on the first substrate 100, and an organic light emitting diode 300 positioned on the functional layer 800.

The functional layer 800 is spaced apart from a first electrode 710 of the organic light emitting diode 300.

Figure 11:
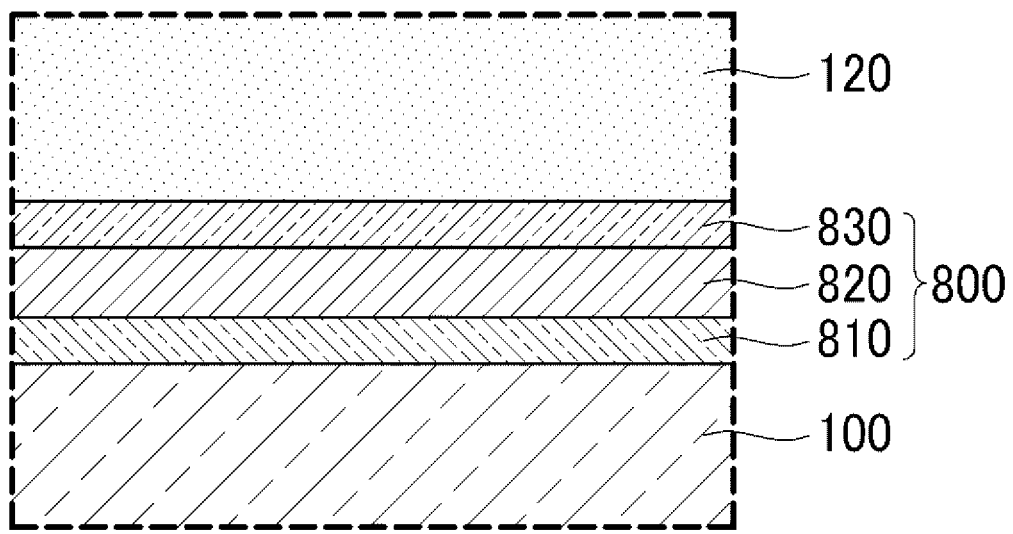
FIG. 11 is a magnified view of section B of FIG. 10.

FIG. 11 is a magnified view of section B of FIG. 10.

In the embodiment shown in FIG. 11, the functional layer 800 is positioned between the first electrode 710 to which light is emitted from the organic emission layer 720, and the first substrate 100. More particularly, the functional layer is positioned between the first substrate 100 and a substrate insulating layer 120, on a path through which light is emitted from the organic emission layer 720 and irradiated to the outside.

In other embodiments of the organic light emitting diode display, the functional layer may be positioned between the first electrode and the substrate insulating layer, spaced part from the first electrode.

The functional layer 800 may be positioned between the first electrode 710 and the first substrate 100, and may be spaced apart from the first electrode 710. The functional layer 800 may include a first semi-transmissive layer 810, a transmissive layer 820, and a second semi-transmissive layer 830.

The functional layer 800 serves to produce constructive interference of the lights irradiated from the organic emission layer 720 to the functional layer 800, as well as of the lights irradiated from the outside to the functional layer 800. The functional layer 800 inhibits external light reflection; light irradiated from the outside to the organic light emitting diode 300 is reflected by at least one of the first electrode 710 and the second electrode 730, by making constructive interference of the lights irradiated to the functional layer 800. The functional layer 800 is positioned between the first electrode 710 and the first substrate 100, thereby suppressing external light reflection caused by the second, light reflective electrode 730. The functional layer 800 also suppresses external light reflection caused by the first electrode 710 and the second electrode 730, thereby minimizing the need to attach a polarizing plate onto the surface of at least one of the first substrate 100 and the second substrate 400, thereby contributing to reduced thickness of the organic light emitting diode display 102. The functional layer 800 is also spaced apart from the first electrode 710, thereby preventing the first electrode 710 from being interfered by the functional layer 800.

While this disclosure has been described in connection with certain exemplary embodiments, it is to be understood that the invention is not limited to the disclosed embodiments, but, on the contrary, is intended to cover various modifications and equivalent arrangements.

What is claimed is:

1. An organic light emitting diode display device, comprising:
   a substrate;
   a functional layer positioned on the substrate, configured to produce constructive interference of lights transmitted from the outside, wherein the functional layer comprises a first semi-transmissive layer, a second semi-transmissive layer and a transmissive layer interposed between the first and second semi-transmissive layers, wherein the thickness of the transmissive layer is greater than the thickness of the first semi-transmissive layer and greater than the thickness of the second semi-transmissive layer, and wherein the first semi-transmissive layer and the second semi-transmissive layer comprise an identical material;
   a first electrode positioned on the functional layer;
   an organic emission layer positioned on the first electrode; and
   a second electrode positioned on the organic emission layer.

2. The organic light emitting diode display device of claim 1, wherein the first electrode is light transmissive, and the second electrode is light reflective.

3. The organic light emitting diode display device of claim 1, wherein the first semi-transmissive layer and the second semi-transmissive layer each comprise a single layer or multiple layers each comprising at least one of Ag, Al, Ca, and Mg.

4. The organic light emitting diode display device of claim 3, wherein the transmissive layer comprises at least one of ITO, IZO, AZO, SiO2, silicon nitride, Nb2O5, and TiO2.

5. The organic light emitting diode display device of claim 4, wherein the transmissive layer has a transmittance of between about 80% and about 100%.

6. The organic light emitting diode display device of claim 5, wherein the functional layer is in contact with the first electrode.

7. The organic light emitting diode display device of claim 5, wherein the functional layer is spaced apart from the first electrode.

8. An organic light emitting diode display device, comprising:
   a substrate configured to substantially transmit incoming light from the exterior of the device;
   a functional layer positioned over the substrate and configured to optically process light from the substrate, wherein the functional layer comprises:
      a first semi-transmissive sub-layer configured to at least partially reflect and at least partially transmit light incident to the first semi-transmissive sub-layer;
      a second semi-transmissive sub-layer configured to at least partially reflect and at least partially transmit light incident to the second semi-transmissive sub-layer;
      a transmissive sub-layer disposed between the first and second semi-transmissive sub-layers, the transmissive sub-layer being configured to substantially transmit light incident to the transmissive sub-layer, wherein the thickness of the transmissive layer is greater than the thickness of the first semi-transmissive layer and greater than the thickness of the second semi-transmissive layer and wherein the first semi-transmissive layer and the second semi-transmissive layer comprise an identical material;
   a first electrode positioned over the functional layer and configured to substantially transmit light incident to the first electrode;
   an organic emission layer positioned over the first electrode, wherein the organic emission layer is configured to emit visible light and substantially transmit light incident to the organic emission layer; and
   a second electrode positioned over the organic emission layer and configured to substantially reflect light incident to the second electrode.

9. The device of claim 8, wherein the device is configured to permit a first light beam from the exterior of the device to pass through the functional layer, the first electrode and the organic emissive layer, and to be reflected at the second electrode.

10. The device of claim 9, wherein the device is further configured to permit a second light beam from the exterior of the device to pass through the first semi-transmissive sub-layer and the transmissive sub-layer, and to be reflected at the second semi-transmissive sub-layer such that the second light beam is constructively reinforced with the first light beam.

11. The device of claim 9, wherein the first and second light beams are further constructively reinforced with a light beam emitted from the organic emission layer.

12. The device of claim 9, wherein the device is further configured to permit a second light beam from the exterior of the device to be reflected at the first semi-transmissive sub-layer such that the second light beam is constructively reinforced with the first light beam.

13. The device of claim 9, wherein the device is further configured to permit a second light beam from the exterior of the device to pass through the first semi-transmissive sub-layer and the transmissive sub-layer, and to be reflected at the second semi-transmissive sub-layer, wherein the device is further configured to permit the second light beam to pass through the transmissive sub-layer and to be reflected at the first semi-transmissive sub-layer, wherein the device is further configured to permit the second light beam to pass through the transmissive sub-layer again and to be reflected at the second semi-transmissive sub-layer again such that the second light beam is constructively reinforced with the first light beam.

14. The device of claim 9, wherein the device is further configured to permit a third light beam from the exterior of the device to be reflected at the first semi-transmissive sub-layer such that the third light beam is constructively reinforced with the second light beam.

15. The device of claim 8, wherein the first semi-transmissive sub-layer and the second semi-transmissive sub-layer each comprise a single layer or multiple layers each comprising at least one of Ag, Al, Ca, and Mg.

16. The device of claim 8, wherein the transmissive sub-layer comprises at least one of ITO, IZO, AZO, SiO2, silicon nitride, Nb2O5, and TiO2.

17. The device of claim 8, wherein the transmissive sub-layer has a transmittance of between about 80% and about 100%.

18. The device of claim 8, wherein the transmissive sub-layer is thicker than the first and second semi-transmissive sub-layers.

* * * * *